US010587219B1

(12) United States Patent
Sandoval et al.

(10) Patent No.: US 10,587,219 B1
(45) Date of Patent: Mar. 10, 2020

(54) SOLAR PANEL DEFROSTER COVER

(71) Applicants: Trinity A. Sandoval, Taylorsville, UT (US); Aaron A. Morris, Taylorsville, UT (US)

(72) Inventors: Trinity A. Sandoval, Taylorsville, UT (US); Aaron A. Morris, Taylorsville, UT (US)

(*) Notice: Subject to any disclaimer, the term of this patent is extended or adjusted under 35 U.S.C. 154(b) by 525 days.

(21) Appl. No.: 14/736,884

(22) Filed: Jun. 11, 2015

Related U.S. Application Data

(60) Provisional application No. 62/010,659, filed on Jun. 11, 2014.

(51) Int. Cl.
*H02S 40/12* (2014.01)
*H02S 40/38* (2014.01)
*H02S 40/34* (2014.01)
*H02S 40/32* (2014.01)
*H05B 3/06* (2006.01)
*H05B 3/36* (2006.01)
*H02J 7/35* (2006.01)
*H02J 7/00* (2006.01)

(52) U.S. Cl.
CPC ............ *H02S 40/12* (2014.12); *H02J 7/0052* (2013.01); *H02J 7/355* (2013.01); *H02S 40/32* (2014.12); *H02S 40/34* (2014.12); *H02S 40/38* (2014.12); *H05B 3/06* (2013.01); *H05B 3/36* (2013.01); *H02J 2007/0059* (2013.01)

(58) Field of Classification Search
CPC .............. H05B 1/00; H05B 3/06; H05B 3/08
USPC ................. 392/392, 393, 422, 473, 480; 136/100–500; 219/541, 209, 213, 553, 219/542, 544, 528, 534, 202, 494, 203, 219/539, 552, 201, 267, 478, 540, 545, 219/546, 548, 549, 121.64, 211, 216, 217, 219/230, 233, 234, 270, 481, 482, 486, 219/500, 509, 510, 521, 522, 529, 531, 219/533, 535, 536, 537, 538
See application file for complete search history.

(56) References Cited

U.S. PATENT DOCUMENTS

| 7,071,446 | B1* | 7/2006 | Bench ................... E04D 13/103 219/211 |
| 8,363,301 | B2 | 1/2013 | Lee et al. |
| 2005/0206530 | A1* | 9/2005 | Cumming .............. G01D 4/006 340/870.02 |
| 2008/0111958 | A1 | 5/2008 | Kleverman et al. |

(Continued)

FOREIGN PATENT DOCUMENTS

| CN | 202098673 U | 1/2012 |
| CN | 202944718 U | 5/2013 |
| CN | 203032626 U | 7/2013 |

Primary Examiner — Tu B Hoang
Assistant Examiner — Vy T Nguyen
(74) Attorney, Agent, or Firm — Cramer Patent & Design, PLLC

(57) ABSTRACT

A transparent film has an adhesive backing adapted to emanate heat through heating elements incorporated throughout the film. The film is applied to a front surface of a solar panel array to provide the heat necessary to melt snow and ice. The device is provided with temperature sensors, inverters, and a battery to enable the device to self-activate and to accumulate and store electric power. When the accumulated snow and ice have been melted, the device de-activates and the transparent nature permits sunlight to enter and charge the solar cells.

6 Claims, 5 Drawing Sheets

(56) References Cited

U.S. PATENT DOCUMENTS

| | | | |
|---|---|---|---|
| 2011/0056924 A1* | 3/2011 | Townsend | H05B 3/84 |
| | | | 219/213 |
| 2013/0105456 A1* | 5/2013 | Fratti | H05B 1/0227 |
| | | | 219/209 |
| 2013/0240015 A1 | 9/2013 | Chaimovski et al. | |
| 2013/0255665 A1* | 10/2013 | Nickel | F24S 40/20 |
| | | | 126/595 |
| 2015/0001201 A1* | 1/2015 | Adler | H01L 31/024 |
| | | | 219/213 |

* cited by examiner

SOLAR PANEL DEFROSTER COVER

RELATED APPLICATIONS

The present invention is a continuation-in-part of, was first described in, and claims the benefit of U.S. Provisional Application No. 62/010,659, filed Jun. 11, 2014, the entire disclosures of which are incorporated herein by reference.

FIELD OF THE INVENTION

The present invention relates to a transparent cover adapted to adhere to a solar panel and configured to emanate heat through heating elements of the cover.

BACKGROUND OF THE INVENTION

From the beginning of time, mankind has relied on various sources of energy to survive. These sources have included wood, coal, oil, wind power, water power, and nuclear energy to just name a few. As each form of energy was discovered, mankind has continued on in the quest for the next, better, form of energy. One (1) recent form of power that is gaining in popularity is that of solar power. It is becoming a very common sight to see photovoltaic modules on roofs of homes, businesses as well as on parking lot structures and open areas of land. However, when such panels become covered with snow, ice, and frost, their power output approaches zero (0) even in direct sunlight. The physical task of removing such obstruction is time consuming, and perhaps even dangerous depending on the panel's physical location. Accordingly, there exists a need for a means by which snow, ice, frost, and other obstructions can be kept off of photovoltaic modules. The development of the present invention fulfills this need.

SUMMARY OF THE INVENTION

It is therefore an object of the present invention to provide such a defrosting system for a solar panel array. The system includes a cover having a front face and a rear face adapted to be affixed to a surface of a photovoltaic module, a heating grid disposed on the front face and configured to generate heat upon being supplied with DC electrical power, a thin film having an outer face and inner face being adapted to cover the heating grid and affix to the front face and configured to transfer heat from the heating grid to the outer face, an electrical junction device configured to selectively draw DC electrical power from the solar panel array and supply DC electrical power to the heating grid when the solar panel power output is above a threshold value and to selectively draw AC electrical power from the ancillary power source and convert AC electrical power to DC electrical power to supply DC electrical power to the heating grid when the solar panel power output is below the threshold value. To accomplish this, at least one (1) temperature sensor is disposed on a surface of either the cover or the solar panel array to measure ambient temperature and convert the ambient temperature to a temperature reading. A thermostatic control is configured to receive a temperature value from a user, the power output from the voltmeter-ammeter, and a temperature reading from each temperature sensor as conditional variables to automatically actuate the electrical switching.

In a preferred embodiment, the transfer of DC electrical power to the heating grid begins when the temperature reading is less than the temperature value, and transfer of the DC electrical power to the heating grid ceases when the temperature reading is greater than the temperature value.

In at least one (1) embodiment, the cover is a transparent polycarbonate material.

In at least one (1) embodiment, the thin film is polycarbonate.

In at least one (1) embodiment, an adhesive member is affixed to the rear face and configured to removably affix the cover to the photovoltaic module. In another embodiment, an adhesive member is affixed to the inner face and configured to permanently affix the thin film to the cover.

In at least one (1) embodiment, the junction device includes electrical connectors configured to enable electrical communication with the solar panel array and an ancillary power source, electrical switching configured to selectively connect the solar panel array, ancillary power source, and heating grid, a differential relay configured to measure solar panel power output of the solar panel array, and a rectifier configured to convert AC electrical power to DC electrical power.

A further object of the present invention is to provide a rechargeable battery configured to receive and supply DC electrical power, the rechargeable battery is in electrical communication with the rectifier and the heating grid. The differential relay is configured to measure battery power output of the rechargeable battery and the junction device is configured to selectively draw AC electrical power from the ancillary power source and convert AC electrical power to DC electrical power and supply DC electrical power to the heating grid and the rechargeable battery when the solar panel power output and the battery power output are below the threshold value.

Yet another object of the present invention provides for a timer in electrical communication with the electrical junction device. The electrical junction device is configured continue transfer of DC electrical power to the heating grid for a minimum time period regardless of the temperature reading, and the electrical junction device is configured to cease transfer of DC electrical power to the heating grid after a maximum time period has elapsed regardless of the temperature reading.

It is a further embodiment to have at least one (1) snow sensor disposed on either the cover or the solar panel array, and a snow melting controller configured to receive an electrical signal value from each snow sensor and the power output from the differential relay as conditional variables to automatically actuate the electrical switching. In this embodiment, upon detection of an accumulation of either snow or ice, the snow melting controller energize the heating grid. Transfer of DC electrical power to the heating grid begins when accumulation is sensed, and transfer of DC electrical power to the heating grid ceases when accumulation is no longer sensed. Further, the electrical junction device is configured to continue transfer of DC electrical power to the heating grid for a minimum time period regardless of accumulation, and the electrical junction device is configured to cease transfer of DC electrical power to the heating grid after a maximum time period has elapsed regardless of accumulation.

BRIEF DESCRIPTION OF THE DRAWINGS

The advantages and features of the present invention will become better understood with reference to the following more detailed description and claims taken in conjunction with the accompanying drawings, in which like elements are identified with like symbols, and in which:

Figure 1:
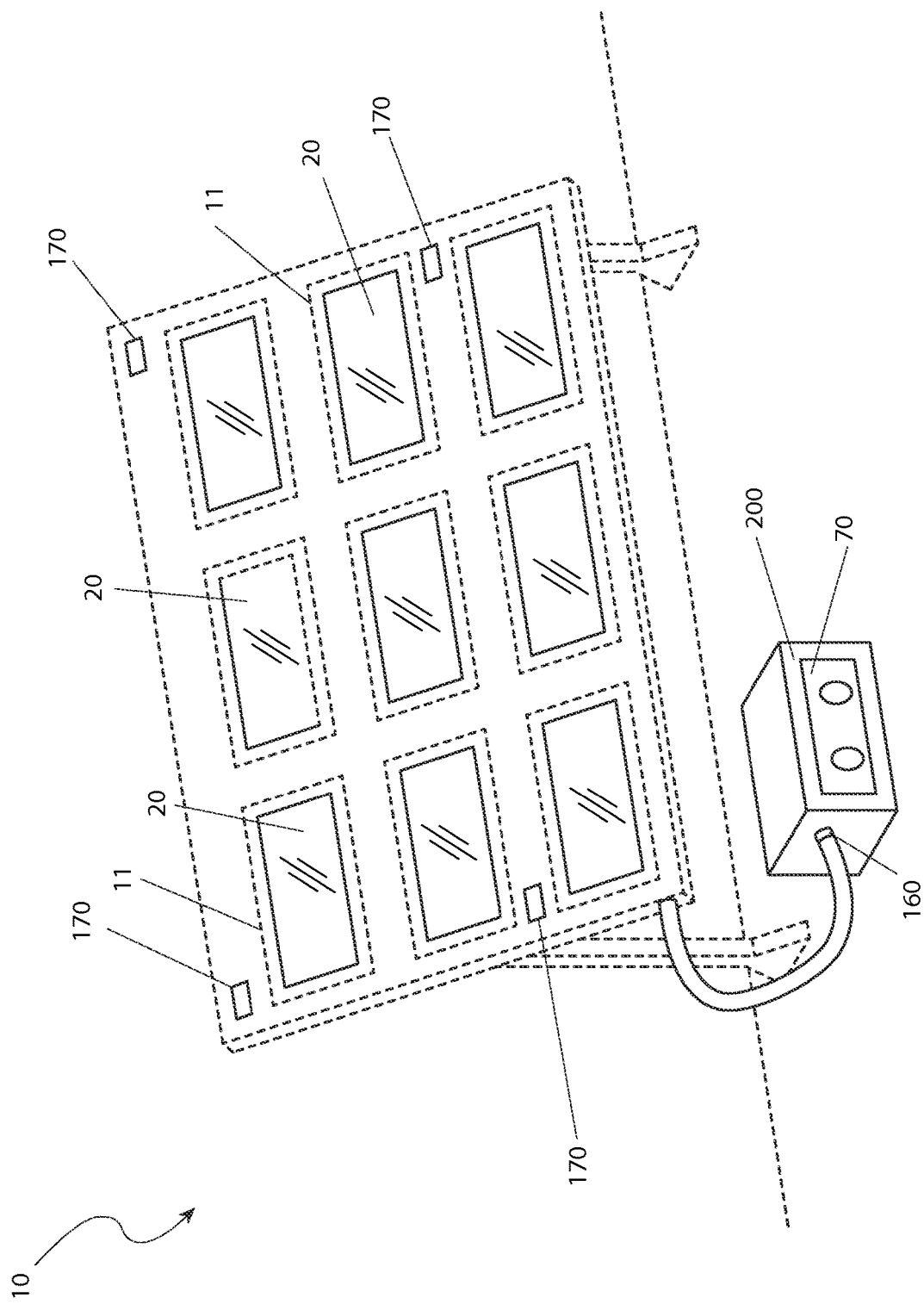
FIG. 1 is an environmental view of a solar panel defroster cover 10, in accordance with the preferred embodiment of the present invention.

DESCRIPTIVE KEY 10 solar panel defroster cover
11 photovoltaic module
20 cover
30 heating grid
40 sheet
50 film
60 DC power
70 snow sensor
80 differential relay
90 AC power
100 power source
110 rectifier
120 battery
130 front face
140 rear face
150 adhesive member
160 electrical connector
170 snow melting controller
190 timer
200 electrical junction device
210 alternative cover

DETAILED DESCRIPTION OF THE PREFERRED EMBODIMENT

Figure 4:
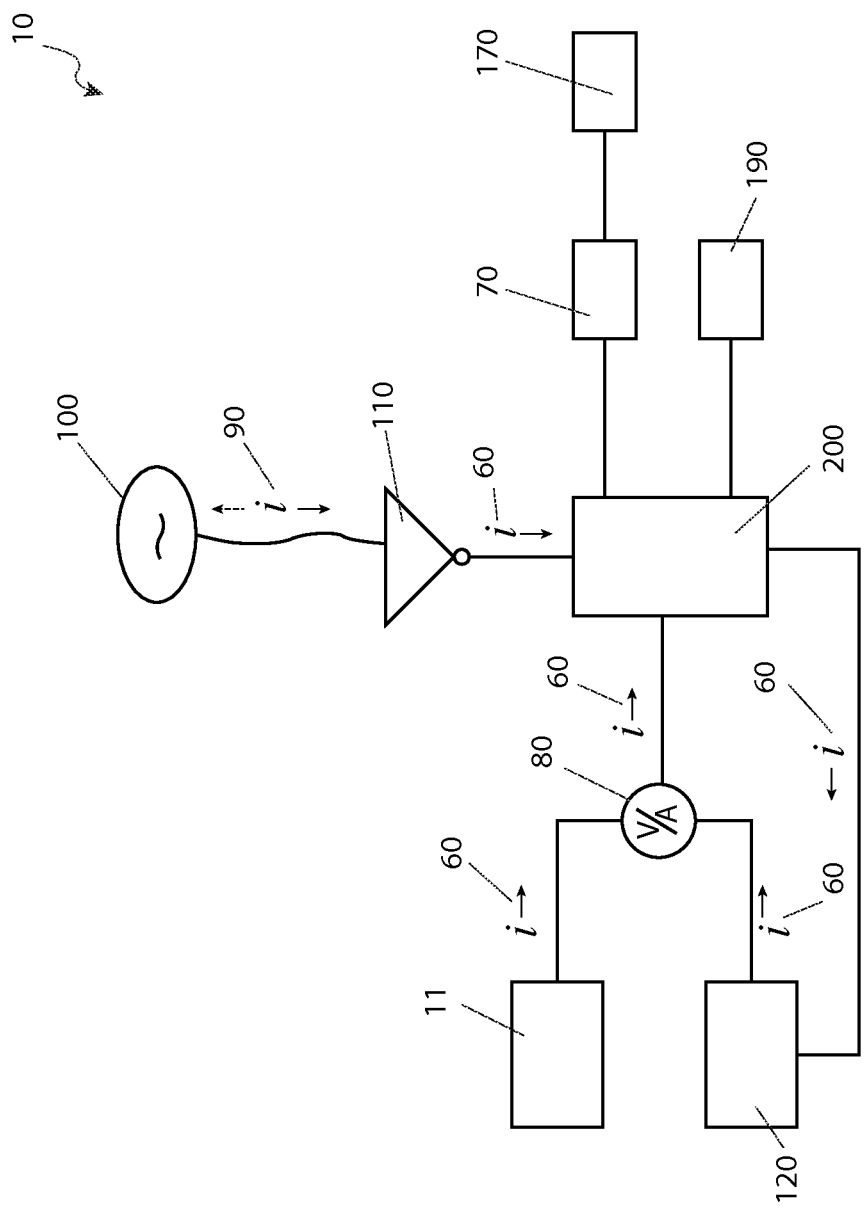
FIG. 4 is an electro-mechanical schematic of the device 10, in accordance with the preferred embodiment of the present invention; and, FIG. 5 is an exploded, partial side view of the alternative cover 210.
Figure 5:
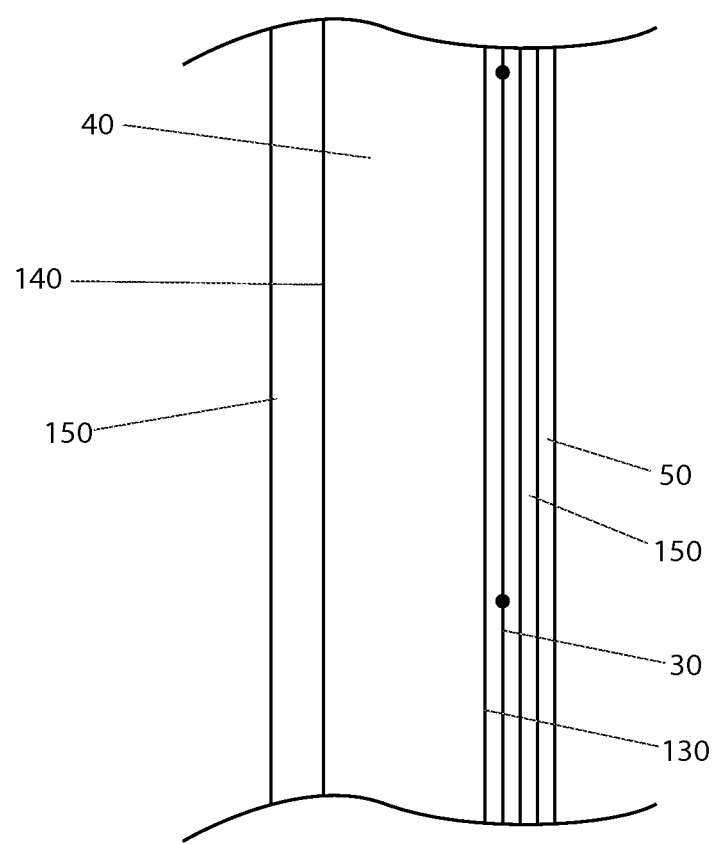

The best mode for carrying out the invention is presented in terms of its preferred embodiment, herein depicted within FIGS. 1 through 4, and an alternative embodiment depicted in FIG. 5. However, the invention is not limited to the described embodiment and a person skilled in the art will appreciate that many other embodiments of the invention are possible without deviating from the basic concept of the invention, and that any such work around will also fall under scope of this invention. It is envisioned that other styles and configurations of the present invention can be easily incorporated into the teachings of the present invention, and only one particular configuration shall be shown and described for purposes of clarity and disclosure and not by way of limitation of scope.

The terms "a" and "an" herein do not denote a limitation of quantity, but rather denote the presence of at least one (1) of the referenced items.

The present invention describes a transparent cover 20 having an adhesive member 150 adapted be placed over photovoltaic modules 11 and configured to emanate heat through a heating grid 30 incorporated throughout the cover 20 (herein referred to as the "system") 10 to melt snow, frost, and ice that may accumulate upon the cover 20.

Figure 2:
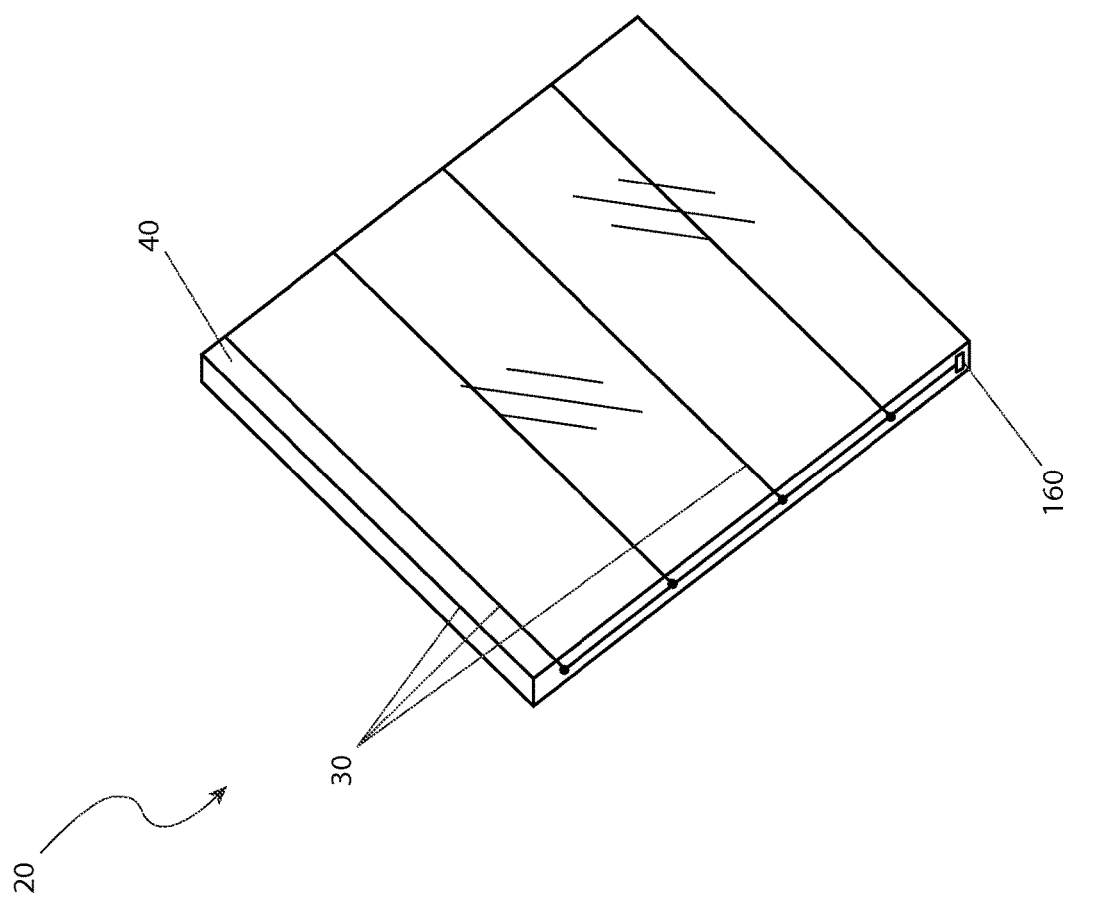
FIG. 2 is a perspective view of the cover 20, in accordance with the preferred embodiment of the present invention.
Figure 3:
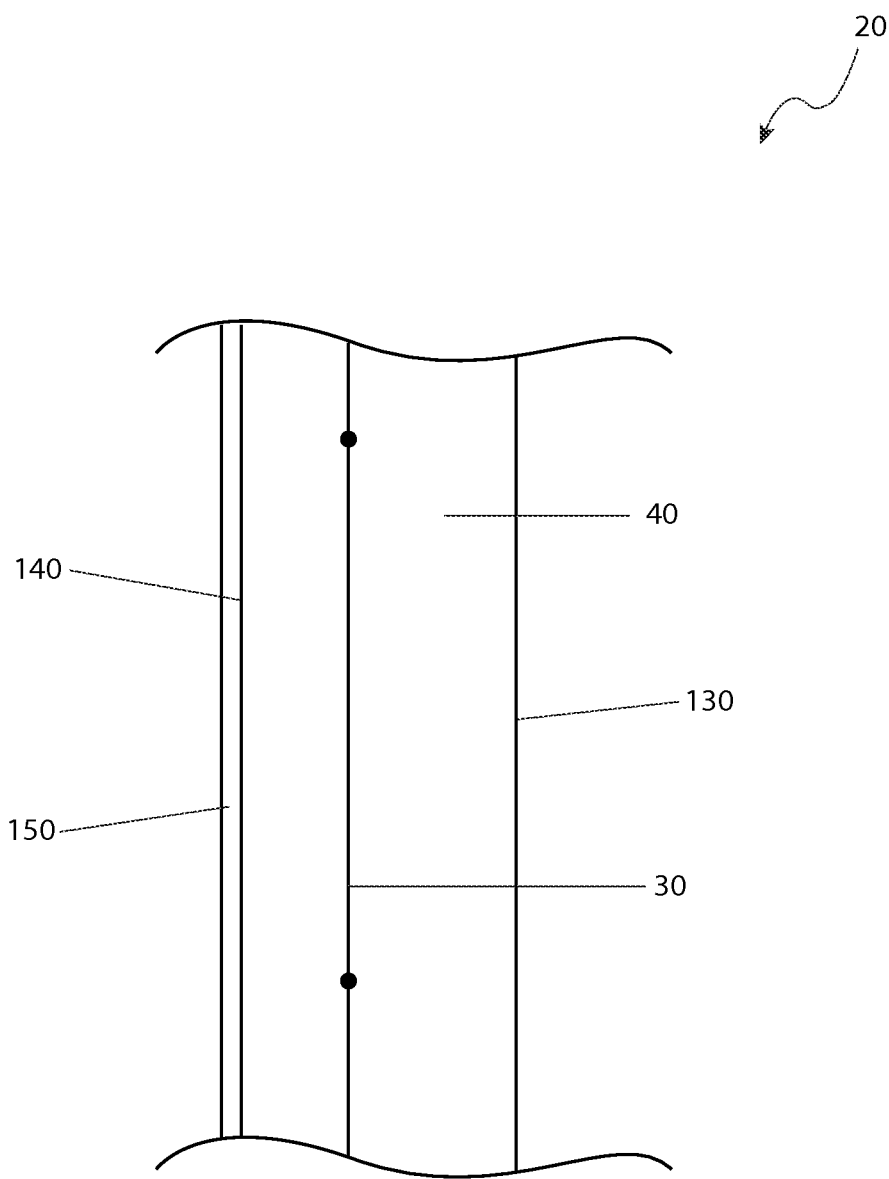
FIG. 3 is an exploded, partial side view of the cover 20, in accordance with the preferred embodiment of the present invention.

Referring now to FIGS. 1 and 2, an environmental view of the system 10 and a perspective view of the cover 20, in accordance with the preferred embodiment of the present invention, are disclosed. The system 10 comprises a cover 20 with integrated heating grid 30 adapted to be applied to a surface of a photovoltaic module 11 of a solar panel array and diminish, or even eliminate, the accumulation of frost, snow, and ice upon the solar panel array. Each cover 20 is a translucent or transparent sheet 40, preferably plastic, that has the heating grid 30, preferably a resistive wire heating element, secured thereto or embedded within. In the embodiment where the heating grid 30 is secured to a surface of the sheet 40, a clear film 50 is used to guard the heating grid 30 by being adhered to a surface of the sheet 40. When sunlight is available to generate electric power from the photovoltaic module 11, the heating grid 30 is powered directly by the solar panel array, which supplies the direct current (DC) power 60 necessary to operate the heating grid 30. This DC power 60 is applied through a snow sensor 70 whenever it detects the presence of snow and/or ice at a certain temperature and quantity. If the snow sensor 70 generates an affirmative signal and there is not enough power being generated by the solar panel array, as measured by a differential relay 80, AC power 90 is provided by a power source 100, such as a standard utility power source. A rectifier 110 then converts this AC power 90 to DC power 60, which is applied to the heating grid 30. For residential use, this rectifier 110 would utilize an input rated at 120/208-volt three-phase or 120/240-volt single phase. The rectifier 110 would have an input rated at 277/480-volt three-phase for larger industrial commercial installations. Alternatively, the power source 100 may be connected to a rechargeable battery 120, which can be availed to supply the DC power 60. While it is envisioned for the system 10 to be employed on top of photovoltaic modules 11, application is certainty not limited to such use, as it may also be used on other transparent/translucent viewing panes such as viewing windows, particularly those positioned at a non-vertical orientation.

The cover 20 comprises the sheet 40 with the heating grid 30. The sheet 40 is shown with a front face 130 and a rear face 140, where the rear face 140 abuts the photovoltaic module 11 when the cover 20 is applied. The sheet 40 preferably comprises a glass or polycarbonate material that is transparent/translucent to sunlight, has a linear coefficient expansion less than $30 \times 10^{-6}$ m/(m·K) at twenty-five degrees Celsius (25° C.), a melting temperature greater than three hundred degrees Fahrenheit (300° F.), a heat transfer coefficient of at least 1.00 W/(m·K) at twenty-five degrees Celsius (25° C.), and a low flammability rating. Although the sheet 40 preferably comprises a thin flexible polycarbonate, it may be rigid as well. The sheet 40 is embedded with a heating grid 30, which is envisioned to be a plurality of heat resistive wires that generate heat when subjected to a DC current 60. The heat is transferred from the wires, through the sheet 40, and into any ice, frost, or snow that may have accumulated onto the front face 130 after the cover has been applied to the photovoltaic module 11. The rear face 140 of the panel is provided with a transparent adhesive member 150, such as a first and second adhesive tape, a double-sided adhesive tape, or even an adhesive bonding agent. The cover 20 is shaped and sized to match the top surface of an individual photovoltaic module 11 so that a cover 20 may be applied to each photovoltaic module 11 separately, and the adhesive member 150 facilitates removably affixing the sheet 40 to a top surface of the photovoltaic module 11.

In an alternative embodiment of the invention, as shown in FIG. 5, the heating grid 30 is disposed on the front face 130 and the front face 130 is then overlaid with a thin film 50 to sandwich the heating grid 30 between the thin film 50 and the sheet 40. It is envisioned for the thin film 50 to comprise a flexible polycarbonate material with a transparent adhesive member 150 similar to the adhesive member 150 described above. Therefore, in this embodiment, the thin film 50 is very similar to the sheet 40 in construction and application, but the heating grid 30 is sandwiched between the sheet 40 and the thin film 50 as opposed to the heating grid 30 being embedded within the sheet 40.

Referring now to FIG. 2, a perspective view of the cover 20, as well as FIG. 4, an electro-mechanical schematic of the device 10, both of which in accordance with the preferred embodiment of the present invention, are disclosed. Each cover 20 is provided with electrical connectors 160, which facilitates electrical communication between the heating grid 30 and an electrical junction device 200. In addition, the electrical junction device 200 has electrical connectors 160 enabling electrical communication between it and the solar panel array. The particular style of electrical connector 160 would depend on the configuration of the electrical plug connector for the solar panel array, but it is envisioned for each electrical connector 160 to be configured with two (2) connecting sockets, a latching mechanism, and some sort of weatherproofing to prevent water infiltration. A typical solar panel array electrical connector is disclosed and displayed in U.S. Pat. No. 7,503,794. The electrical junction device 200 is provided with a rectifier 110 to covert AC power 90 of the power source 100 to DC power 60 before being supplied to the heating grid 30. The electrical junction device 200 is further configured to enable electrical communication between the heating grid 30 and the solar panel array so as to facilitate DC power 60 transfer from the photovoltaic modules 11 to the heating grid 11. In an alternative embodiment of the invention, a rechargeable battery 120 is placed within the electrical junction device 200 and is configured to receive DC power 60 from the photovoltaic modules 11 and the power source 100. The rechargeable battery 120 is further configured to supply DC power 60 to the heating grid 30 when needed.

In electrical communication with the electrical junction device 200, either hard wired or wirelessly, is a snow sensor 70. The snow sensor 70 is provided with an interface to a snow melting controller 170. The snow melting controller 170 allows the system 10 to energize the heating grid 30 with DC power 60 through a dry contact interface. The snow melting controller 170 determines various wintertime weather parameters such as temperature, rate of snow fall, type of snow, and institutes a suitable run time for the system 10. The snow sensor 70 is well known in the art and is similar in nature to that of the ETI CIT-1 snow sensor, as manufactured by the Pentair Company. The snow sensor 70 accurately detects falling or blowing snow as precipitation at temperatures below 38° F. (3.3° C.) for surface snow melting applications. The snow melting controller would be similar in nature to that of the ETI APS-3B or APS-4 Control Panel, also as manufactured by the Pentair Company. At least one (1) snow sensor 70 is disposed on a surface of the cover 20 or solar panel array, each in electrical communication with the snow melting controller 170. Each snow sensor 70 is envisioned to comprise a semi-conductor device having an electrical conductivity that is dependent upon the ambient environment to which the device is exposed; however, it is understood that other snow sensors, precipitation sensors, temperature sensors and/or temperature sensing techniques may be utilized without deviating from the teachings of the system 10. The snow melting controller 170 is configured to use conductivity values as proxies of snow and/or ice accumulations and thusly determine the necessity of energizing the heating grid 30. Such parameters then determine the amount of time the heating grid 30 should be energized as well, thus providing feedback for the system 10. In an alternative embodiment of the invention, the electrical junction device 200 includes timer 190 so as to provide upper and lower timer period boundaries for the DC power 60 transfer. Where the timer 190 is used, the DC power 60 transfer continues for a minimum time period (the lower time period boundary) after being initiated and a maximum time period (the upper time period boundary) after being initiated, regardless of whether the snow melting controller 170 has de-energized the system 10. The timer 190 is envisioned to be a solid state timer operable on DC current and has flip-flop solid states to enable repeated switching. Such timers 190 are common in the art as the one (1) disclosed and described in U.S. Pat. No. 3,714,519.

A differential relay 80 is provided with the electrical junction device 200, which measures the DC power 60 output of the photovoltaic module 11 and that of the rechargeable battery 120 when the snow sensor 70 is powered "ON". The purpose of the differential relay 80 is to provide feedback to the electrical junction device 200 to enable the electrical junction device 200 to selectively draw electrical power 60, 90 from the power source 100, rechargeable battery 120, or solar panel array, and selectively supply electrical power 60 to the heating grid 30 and/or rechargeable battery 120. This differential relay 80 may be a series of load circuits that produces positive and negative current magnitudes that are proportional to voltage/ampere references taken from terminals of the solar panel array and rechargeable battery 120, which are used as feedback signals by the electrical junction device 200; however, other types and methods of measuring voltage and/or ampere levels and producing differential signals may be utilized. The electrical circuitry of the electrical junction device 200 is configured to transfer DC power 60 from the photovoltaic module 11 upon the snow melting controller 170 energizing the heating grid 30 but only if the DC power 60 current output of the photovoltaic module 11 is below a threshold amount, an amount required for sustainable use of the heating grid 30 for the maximum time period as set by the snow melting controller or the timer 190, then the electrical circuitry draws DC power 60 from the rechargeable battery 120. However, if the DC power 60 output of the rechargeable battery 120 is also below this threshold amount, then AC power 90 is drawn from the power source 100 and routed through the rectifier 110 to supply DC power 60 to both the heating grid 30 and the rechargeable battery 120.

In the instance where it is necessary to fulfill multiple modules 11 in the solar panel array, it is envisioned that multiple systems 10 can be connected to each other to accomplish this.

It is envisioned that other styles and configurations of the present invention can be easily incorporated into the teachings of the present invention, and only one particular configuration shall be shown and described for purposes of clarity and disclosure and not by way of limitation of scope.

The preferred embodiment of the present invention can be utilized in a simple and straightforward manner with little or no training After initial purchase or acquisition of the system 10, it would be configured as indicated in FIG. 1.

The method of utilizing the system 10 may be achieved by performing the following steps: acquiring a model of the system 10; ensuring that the size and shape of the cover 20 substantially matches the size and shape of an individual photovoltaic module 11 of a solar panel array; cleaning a top surface of each photovoltaic module 11 to be covered by the cover 20; adhering a cover 20 to a photovoltaic module 11 by abutting the rear face 140 of the cover 20 to a top surface of the photovoltaic module 11, thereby allowing the adhesive member 150 to temporarily hold the cover 20 in place; connecting the electrical junction device 200 and the solar panel array to the cover via the electrical connectors 160; connecting the electrical junction device 200 to a power source 100; manipulating the snow sensor 70 and the snow melting controller 170 to power ON the system 10; allowing the system to automatically enable and interrupt DC power 60 transfer to the heating grid 30 based upon the presence or snow and/or ice as determined by the snow sensor 70 and the upper and lower time period boundaries of the timer 190; allowing the system 10 to automatically draw electrical power 60, 90 from the power source 100, rechargeable battery 120, or solar panel array, and selectively supply electrical power 60 to the heating grid 30 and/or rechargeable battery 120 based upon differential relay 80 signals; and, availing the benefits of automatically diminishing, or eliminating, accumulation of frost, snow, and ice upon the solar panel array.

The foregoing descriptions of specific embodiments of the present invention have been presented for purposes of illustration and description. They are not intended to be exhaustive or to limit the invention and method of use to the precise forms disclosed. Obviously many modifications and variations are possible in light of the above teaching. The embodiment was chosen and described in order to best explain the principles of the invention and its practical application, and to thereby enable others skilled in the art to best utilize the invention and various embodiments with various modifications as are suited to the particular use contemplated. It is understood that various omissions or substitutions of equivalents are contemplated as circumstance may suggest or render expedient, but is intended to cover the application or implementation without departing from the spirit or scope of the claims of the present invention.

The invention claimed is:

1. A defrosting system for a solar panel array, comprising:
a cover having a transparent member having a front face and a rear face, said rear face affixed to a surface of a photovoltaic module;
a heating grid embedded within said cover to generate heat upon being supplied with an electrical power;
an electrical junction box in electrical communication with said heating grid, said solar panel array, an ancillary electrical power source, and a rechargeable battery via a differential relay;
a snow sensor sensing snow build-up on said cover;
a snow melting controller receiving inputs from said electrical junction box and from said snow sensor, said snow melting controller for automatically causing said electrical junction box to supply electrical power to said heating grid upon detection of an accumulation of either snow or ice;
wherein said cover transferring said heat from said heating grid to said front face, wherein said cover is polycarbonate;
a timer in electrical communication with said electrical junction box, wherein said electrical junction box supplies said electrical power to said heating grid for a minimum time period and said electrical junction box interrupts said supply of electrical power to said heating grid after a maximum time period; and
an adhesive member affixed to said rear face to enable removably affixing said cover to said photovoltaic module;
wherein the rechargeable battery selectively received the electrical power from the ancillary electrical power source and the photovoltaic module via the differential relay, and
wherein the electrical power is selectively drawn from the photovoltaic module, the ancillary electrical power source, and the rechargeable battery via the differential relay,
wherein the ancillary electrical power source supplying power to both the rechargeable battery and the heating grid at a same time when the rechargeable battery and the photovoltaic module are below threshold for sustainable use of heating grid via a measurement of the differential relay.

2. The system recited in claim 1, wherein said electrical junction box draws said electrical power from and supplies said electrical power to said rechargeable battery.

3. A defrosting system for a solar panel array, comprising:
a cover having a transparent member having a front face and a rear face, said rear face affixed to a surface of a photovoltaic module;
a heating grid embedded within said cover to generate heat;
an electrical junction box in electrical communication with said heating grid, said solar panel array, an ancillary electrical power source, and a rechargeable battery via a differential relay;
a rectifier converting AC electrical power to DC electrical power;
a snow sensor sensing snow or ice on said cover;
a snow melting controller receiving information from said snow sensor and to automatically energize said heating grid upon detection of an accumulation of either snow or ice and to stop energizing said heating grid when said accumulation is no longer sensed;
wherein said cover transferring said heat from said heating grid to said front face, wherein said cover is polycarbonate;
a timer in electrical communication with said electrical junction box, wherein said electrical junction box supplies said electrical power to said heating grid for a minimum time period and said electrical junction box interrupts said supply of electrical power to said heating grid after a maximum time period; and
an adhesive member affixed to said rear face to enable removably affixing said cover to said photovoltaic module; and
the rechargeable battery, wherein said rechargeable battery received and supplied said DC electrical power, said rechargeable battery is in electrical communication with said rectifier and said heating grid, and said differential relay measuring battery power output of said rechargeable battery,
wherein the rechargeable battery selectively received the DC electrical power from the ancillary electrical power source and the solar panel via the differential relay, and
wherein the DC electrical power is selectively drawn from the photovoltaic module, the ancillary electrical power source, and the rechargeable battery via the differential relay,
wherein the ancillary electrical power source supplying the DC electrical power to both the rechargeable battery and the heating grid at a same time when the rechargeable battery and the photovoltaic module are below threshold for sustainable use of heating grid via a measurement of the differential relay.

4. A defrosting system for a solar panel array, comprising:

a cover having a transparent member having a front face and a rear face, said rear face affixed to a surface of a photovoltaic module;

a heating grid disposed on said front face to generate heat upon being supplied with DC electrical power;

a thin film having an outer face and inner face, said inner face covering said heating grid and affix to said front face;

an electrical junction box in electrical communication with said heating grid, said solar panel array, an ancillary electrical power source, and a rechargeable battery via a differential relay;

the differential relay measuring solar panel power output of said solar panel array;

a rectifier converting AC electrical power to DC electrical power;

a snow sensor detecting an accumulation of either snow or ice on said cover, wherein said cover is polycarbonate;

a snow melting controller operatively connected to said snow sensor, said snow melting controller automatically causing said electrical junction box to transfer DC electrical power to said heating grid upon detection of an accumulation of either snow or ice;

wherein said thin film transferring said heat from said heating grid to said outer face;

a timer in electrical communication with said electrical junction box, wherein said electrical junction box continuing and transferring of said DC electrical power to said heating grid for a minimum time period regardless of said accumulation and said electrical junction box ceasing and transferring said DC electrical power to said heating grid after a maximum time period has elapsed regardless of said accumulation;

an adhesive member affixed to said rear face and enabling removably affixing said cover to said photovoltaic module; and wherein said transfer of said DC electrical power to said heating grid begins when said accumulation is sensed and wherein said transfer of said DC electrical power to said heating grid ceases when said accumulation is no longer sensed, wherein the rechargeable battery selectively received the DC electrical power from the ancillary electrical power source and the solar panel via the differential relay, and wherein the DC electrical power is selectively drawn from the photovoltaic module, the ancillary electrical power source, and the rechargeable battery via the differential relay, wherein the ancillary electrical power source supplying the DC electrical power to both the rechargeable battery and the heating grid at a same time when the rechargeable battery and the photovoltaic module are below threshold for sustainable use of heating grid via a measurement of the differential relay.

5. The system recited in claim 4, wherein said thin film is polycarbonate.

6. The system recited in claim 4, wherein:

said rechargeable battery receives and supplies said DC electrical power;

said rechargeable battery in electrical communication with said rectifier and said heating grid;

said differential relay measuring battery power output of said rechargeable battery.

* * * * *